(12) United States Patent
Jeong et al.

(10) Patent No.: US 10,580,812 B2
(45) Date of Patent: *Mar. 3, 2020

(54) FAN-OUT SENSOR PACKAGE AND CAMERA MODULE INCLUDING THE SAME

(71) Applicant: SAMSUNG ELECTRONICS CO., LTD., Suwon-si (KR)

(72) Inventors: Tae Sung Jeong, Suwon-si (KR); Ju Ho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/572,151

(22) Filed: Sep. 16, 2019

(65) Prior Publication Data

US 2020/0013814 A1   Jan. 9, 2020

Related U.S. Application Data

(63) Continuation of application No. 15/449,047, filed on Mar. 3, 2017, now Pat. No. 10,431,615.

(30) Foreign Application Priority Data

Sep. 23, 2016   (KR) .......................... 10-2016-0122215

(51) Int. Cl.
*H01L 27/146* (2006.01)
*H04N 5/225* (2006.01)

(52) U.S. Cl.
CPC .. *H01L 27/14618* (2013.01); *H01L 27/14621* (2013.01); *H01L 27/14627* (2013.01);
(Continued)

(58) Field of Classification Search
CPC ......... H01L 27/14618; H01L 27/14627; H01L 27/14636; H01L 27/14621;
(Continued)

(56) References Cited

U.S. PATENT DOCUMENTS 9,136,293 B2   9/2015   Yee et al.
9,618,712 B2   4/2017   Kuo et al.
(Continued)

FOREIGN PATENT DOCUMENTS

JP   2011-003961 A   1/2011
KR   10-2008-0064088 A   7/2008
(Continued)

OTHER PUBLICATIONS

Korean Office Action dated Feb. 21, 2019 issued in Korean Patent Application No. 10-2016-0122215 (with English translation).
(Continued)

*Primary Examiner* — Pritham D Prabhakher
(74) *Attorney, Agent, or Firm* — Sughrue Mion, PLLC

(57) ABSTRACT

A fan-out sensor package includes: a first interconnection member having a through-hole; a sensor disposed in the through-hole of the first interconnection member and having an active surface having connection pads and microlenses disposed thereon and an inactive surface opposing the active surface; an encapsulant encapsulating at least portions of the first interconnection member and the active surface or the inactive surface of the sensor; and a second interconnection member disposed on the first interconnection member and the inactive surface or the active surface of the sensor. The first interconnection member and the second interconnection member include, respectively, redistribution layers electrically connected to the connection pads of the sensor. A camera module includes the fan-out sensor package.

18 Claims, 12 Drawing Sheets

(52) U.S. Cl.
CPC ..... *H01L 27/14636* (2013.01); *H04N 5/2257* (2013.01); *H01L 2224/04105* (2013.01); *H01L 2224/12105* (2013.01); *H01L 2224/18* (2013.01); *H01L 2224/24195* (2013.01); *H01L 2224/24227* (2013.01); *H01L 2924/15311* (2013.01)

(58) Field of Classification Search
CPC ......... H01L 27/14625; H01L 27/14685; H01L 27/14683; H01L 2224/24195; H01L 2224/24227; H01L 2224/18; H01L 2224/04105; H01L 2224/12105; H01L 2224/20; H01L 2224/0401; H01L 2224/2518; H01L 2224/24137; H01L 2924/0002; H01L 2924/15311; H01L 2924/01078; H01L 2924/01079; H01L 2924/14; H01L 2924/30107; H01L 2924/01013; H01L 2924/01029; H01L 2924/01059; H01L 2924/01082; H01L 2924/078; H01L 2924/09701; H01L 2924/3011; H01L 2924/01033; H01L 2924/01075; H01L 2924/3512; H01L 2924/00; H01L 23/3107; H01L 23/481; H01L 23/3185; H01L 23/49816; H01L 23/49827; H01L 23/49833; H01L 24/19; H01L 24/05; H01L 24/13; H01L 24/24; H01L 24/82; H01L 24/29; H01L 25/0655; H01L 25/0657; H01L 25/105; H01L 2225/06524; H01L 2225/06541; H01L 2225/06572; H01L 2225/06582; H01L 2225/1035; H01L 2225/1058; H01L 31/0203; H01L 31/02327; H04N 5/2253; H04N 5/2254; H04N 5/2252
USPC ......................................................... 348/294
See application file for complete search history.

(56) References Cited

U.S. PATENT DOCUMENTS

| | | | |
|---|---|---|---|
| 9,773,831 B1 | 9/2017 | Yang et al. | |
| 9,899,307 B2* | 2/2018 | Lin | H01L 23/49827 |
| 9,899,442 B2* | 2/2018 | Katkar | H01L 27/1464 |
| 9,899,443 B2* | 2/2018 | Lee | H01L 27/14634 |
| 9,917,123 B2 | 3/2018 | Chen et al. | |
| 10,037,961 B2* | 7/2018 | Chiu | H01L 24/14 |
| 10,090,358 B2* | 10/2018 | Yang | H01L 27/14618 |
| 10,424,563 B2* | 9/2019 | Lin | H01L 23/5389 |
| 2008/0083980 A1 | 4/2008 | Yang et al. | |
| 2008/0157336 A1 | 7/2008 | Yang | |
| 2008/0157358 A1 | 7/2008 | Yang | |
| 2008/0211075 A1 | 9/2008 | Yang et al. | |
| 2008/0274579 A1 | 11/2008 | Yang et al. | |
| 2008/0290438 A1* | 11/2008 | Weng | H01L 27/14618 257/434 |
| 2009/0008729 A1* | 1/2009 | Yang | H01L 27/14618 257/432 |
| 2009/0166873 A1 | 7/2009 | Yang et al. | |
| 2011/0193216 A1 | 8/2011 | Lin et al. | |
| 2014/0070348 A1 | 3/2014 | Yee et al. | |
| 2015/0325557 A1 | 11/2015 | Yiu et al. | |
| 2016/0172402 A1* | 6/2016 | Katkar | H01L 27/1464 257/292 |
| 2017/0040374 A1 | 2/2017 | Oh et al. | |
| 2017/0048472 A1 | 2/2017 | Yang et al. | |
| 2017/0077158 A1 | 3/2017 | Huang et al. | |
| 2017/0092680 A1 | 3/2017 | Kwon | |
| 2017/0186678 A1* | 6/2017 | Lin | H01L 23/49827 |
| 2017/0271283 A1* | 9/2017 | Lee | H01L 24/02 |
| 2017/0338196 A1* | 11/2017 | Chiu | H01L 24/14 |
| 2018/0025986 A1* | 1/2018 | Chiu | H01L 23/5389 257/531 |
| 2018/0026067 A1* | 1/2018 | Lee | H01L 27/14634 257/777 |

FOREIGN PATENT DOCUMENTS

| | | |
|---|---|---|
| TW | 200935574 A | 8/2009 |
| TW | 201719825 A | 6/2017 |

OTHER PUBLICATIONS

Taiwanese Office Action issued in corresponding Taiwanese Patent Application No. 106107459 dated May 10, 2018, with English Translation.

* cited by examiner

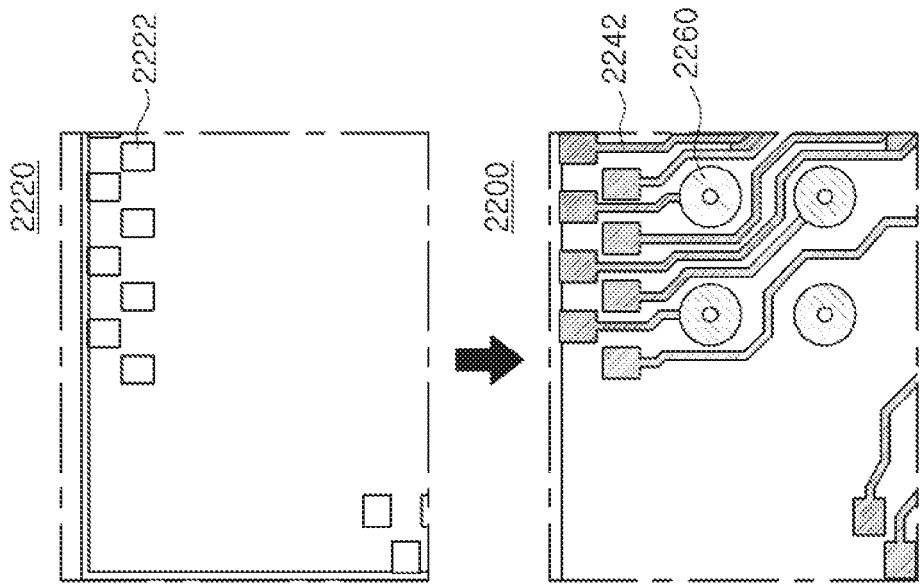
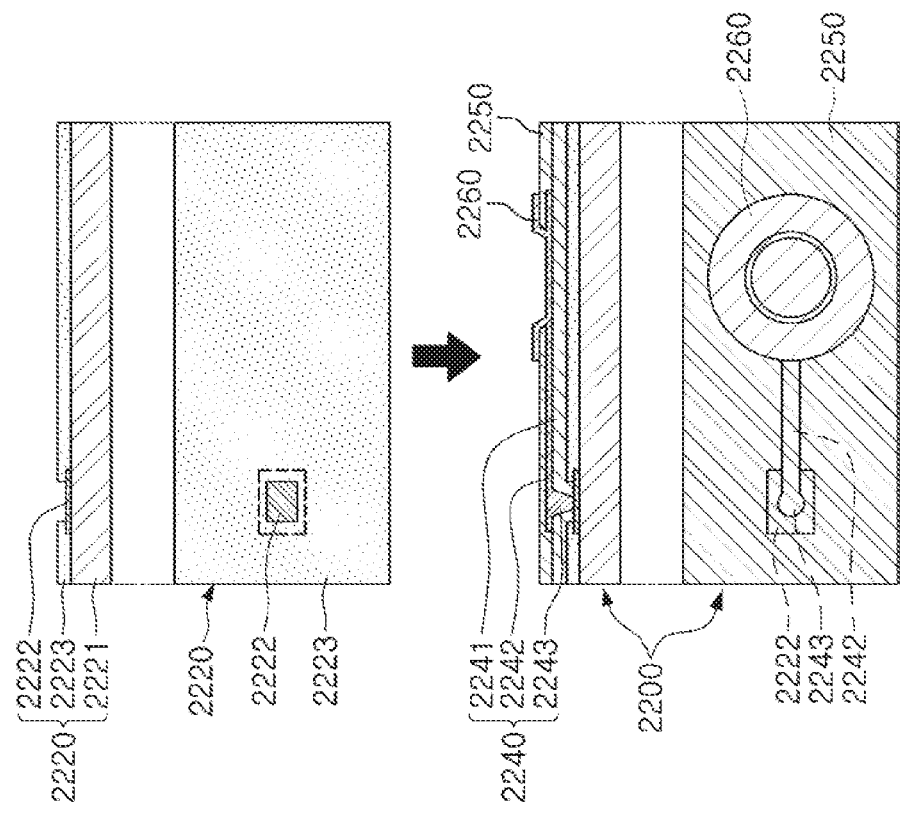
FIG. 3B
FIG. 3A

II-II'

III-III'

FAN-OUT SENSOR PACKAGE AND CAMERA MODULE INCLUDING THE SAME

CROSS-REFERENCE TO RELATED APPLICATION(S)

This is a Continuation Application of U.S. application Ser. No. 15/449,047 filed on Mar. 3, 2017, which claims benefit of priority to Korean Patent Application No. 10-2016-0122215 filed on Sep. 23, 2016 in the Korean Intellectual Property Office, the disclosures of which are incorporated herein by reference in their entireties.

TECHNICAL FIELD

The present disclosure relates to a fan-out sensor package used in a camera module and a camera module including the same.

BACKGROUND

In packaging technology of devices used in mobile products such as a smartphone or a tablet personal computer (PC), miniaturization and performance improvement of the devices have been continuously demanded. That is, efforts to manufacture a package at a small size and add more functions in the same space have been conducted. Particularly, a demand for miniaturization of components having additional functions rather than a main component has increased. For example, a demand for miniaturization and performance improvement of an image sensor package used in a camera module, or the like, has increased.

Meanwhile, an image sensor package according to the related art has been manufactured by attaching an image sensor to a printed circuit board or a ceramic board using an adhesive, or the like, and interconnecting the image sensor and the printed circuit board using wire bonding technology. In this case, there was a limitation in the miniaturization and the performance improvement of the image sensor package described above.

SUMMARY

An aspect of the present disclosure may provide a fan-out sensor package of which miniaturization and performance improvement are possible, and a camera module including the same.

According to an aspect of the present disclosure, a fan-out sensor package configured using interconnection members including redistribution layers may be provided.

According to an aspect of the present disclosure, a fan-out sensor package may include: a first interconnection member having a through-hole; a sensor disposed in the through-hole of the first interconnection member and having an active surface having connection pads and microlenses disposed thereon and an inactive surface opposing the active surface; an encapsulant encapsulating at least portions of the first interconnection member and the active surface of the sensor; and a second interconnection member disposed on the first interconnection member and the inactive surface of the sensor. The second interconnection member includes a redistribution layer electrically connected to the connection pads of the sensor.

According to another aspect of the present disclosure, a fan-out sensor package may include: a first interconnection member having a through-hole; a sensor disposed in the through-hole of the first interconnection member and having an active surface having connection pads and microlenses disposed thereon and an inactive surface opposing the active surface; an encapsulant encapsulating at least portions of the first interconnection member and the sensor; and a second interconnection member disposed on the first interconnection member and the sensor. The first interconnection member and the second interconnection member include, respectively, redistribution layers electrically connected to the connection pads of the sensor, and at least one of the redistribution layers of the first interconnection member is disposed on a level between the active surface and the inactive surface of the sensor.

According to another aspect of the present disclosure, a camera module may include: a housing accommodating a lens module therein; and an image sensor module coupled to the housing and converting light passing through the lens module into an electrical signal. The image sensor module is the fan-out sensor package described above.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or omitted for clarity.

Herein, a lower side, a lower portion, a lower surface, and the like, are used to refer to a direction toward a mounted surface of the fan-out sensor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
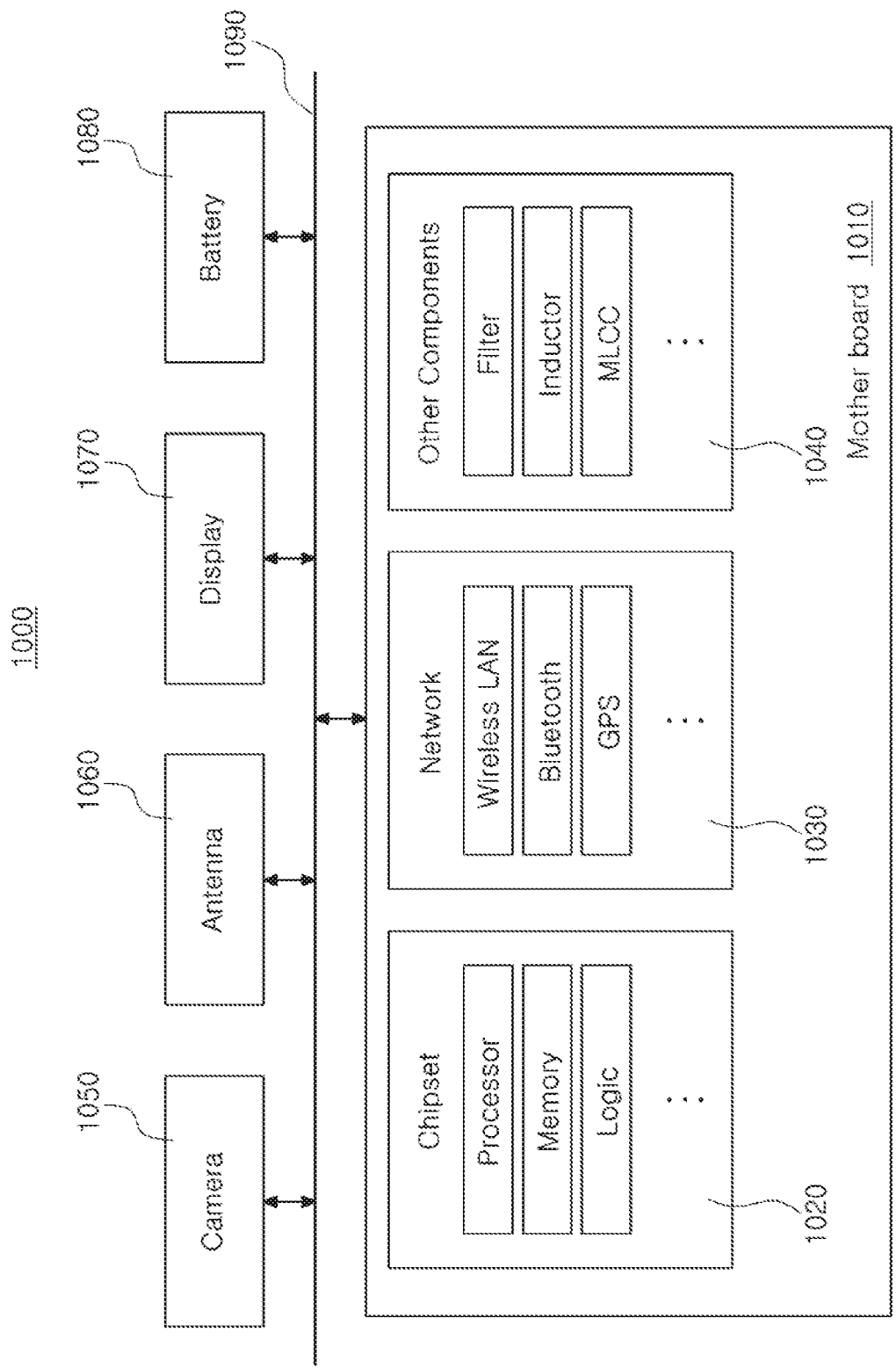
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may be compatible with protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data any other electronic device able to process data.

Figure 2:
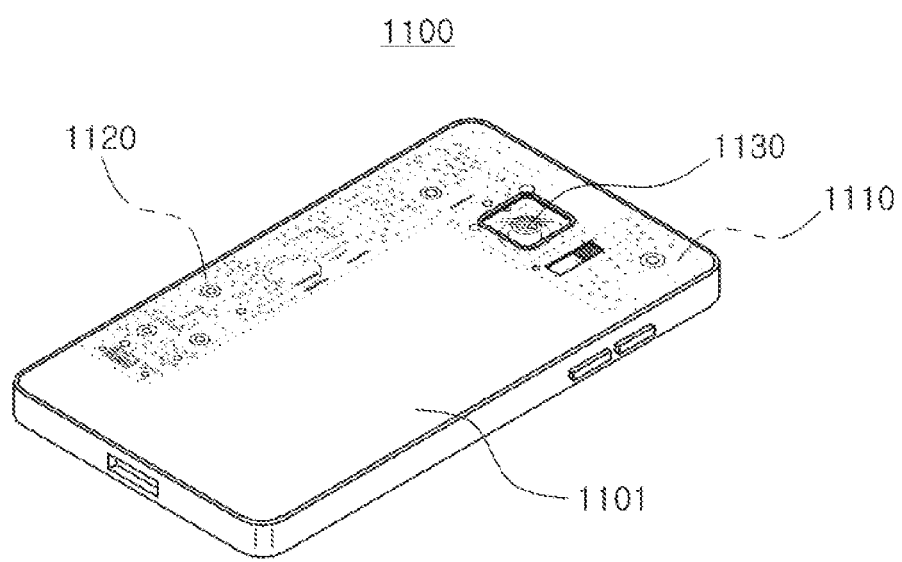
FIG. 2 is a schematic perspective view illustrating an example of an electronic device.

FIG. 2 is a schematic perspective view illustrating an example of an electronic device.

Referring to the drawing, an electronic device may be, for example, a smartphone 1100. A main board 1110 may be accommodated in a body 1101 of the smartphone 1100, and various electronic components 1120 may be physically or electrically connected to the main board 1110. In addition, other components that may or may not be physically or electrically connected to the main board 1110, such as the camera module 1130, may be accommodated in the body 1101. The camera module 1130 may include an image sensor package, and a fan-out sensor package according to the present disclosure may be used in the smartphone. Meanwhile, the electronic device in which the fan-out sensor package according to the present disclosure is used is not limited to the smartphone 1100. That is, the fan-out sensor package according to the present disclosure may also be used in other electronic devices.

Semiconductor Package

A fan-out sensor package according to the present disclosure may be manufactured using technology of a semiconductor package. Generally, numerous fine electrical circuits are integrated in a semiconductor. However, the semiconductor may not serve as a finished semiconductor product itself, and may be damaged due to external physical or chemical impacts. Therefore, the semiconductor itself may not be used, but may be packaged and used in an electronic device, or the like, in a packaged state.

Here, semiconductor packaging is required due to the existence of a difference in circuit widths between the semiconductor and a main board of the electronic device in terms of electrical connections. In detail, a size of connection pads of the semiconductor and intervals between the connection pads of the semiconductor are very fine, while sizes of component mounting pads of the main board and intervals between the component mounting pads of the main board are significantly larger than those of the semiconductor. Therefore, it may be difficult to directly mount the semiconductor on the main board, and packaging technology for buffering a difference in circuit widths between the semiconductor and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
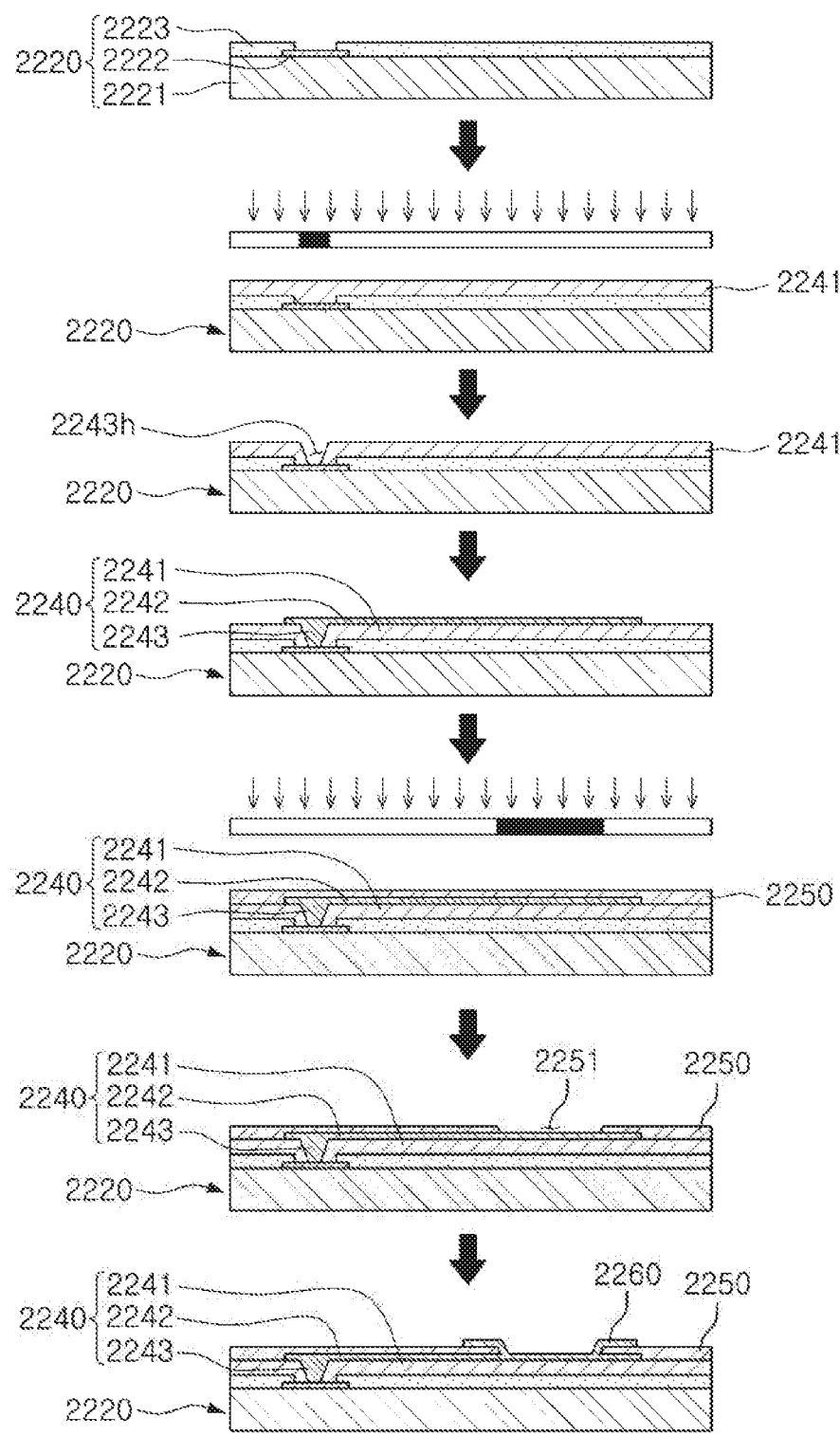
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a interconnection member 2240 may be formed on the semiconductor chip 2220 depending on a size thereof in order to redistribute the connection pads 2222. The interconnection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an underbump metal layer 2260, or the like, may be formed. That is, a fan-in semiconductor package 2200 including, for example, the semiconductor chip 2220, the interconnection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor are disposed inside the semiconductor, may have excellent electrical characteristics and may be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor in the fan-in semiconductor package, the fan-in semiconductor package has a large spatial limitation. Therefore, it is difficult to apply this structure to a semiconductor having a large number of I/O terminals or a semiconductor having a compact size. In addition, due to the disadvantage described above, the fan-in semiconductor package may not be directly mounted and used on the main board of the electronic device. Here, even in the case that a size of the I/O terminals of the semiconductor and an interval between the I/O terminals of the semiconductor are increased by a redistribution process, the size of the I/O terminals of the semiconductor and the interval between the I/O terminals of the semiconductor may not be sufficient to directly mount the fan-in semiconductor package on the main board of the electronic device.

Figure 5:
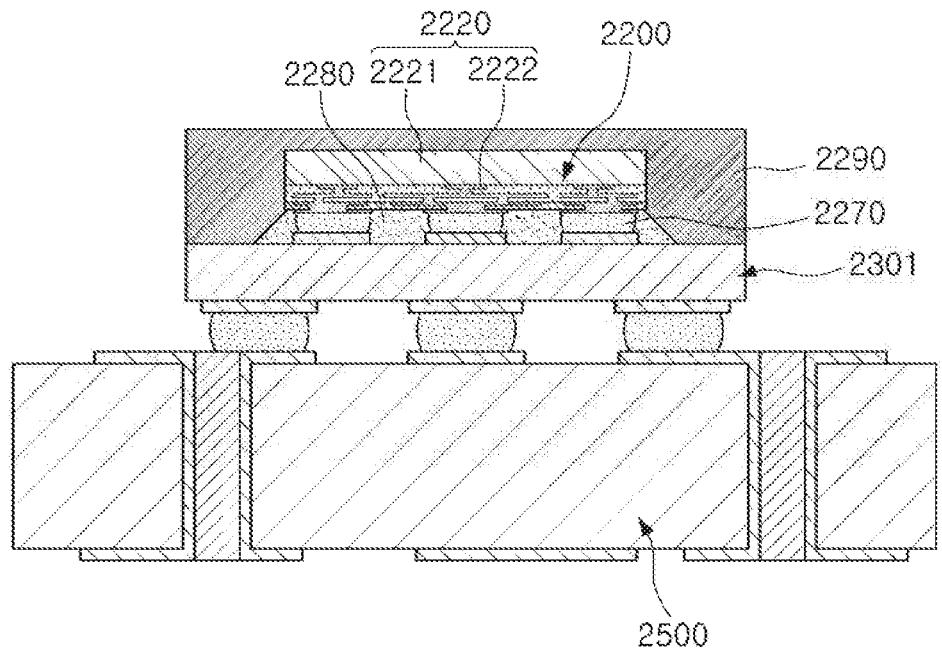
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
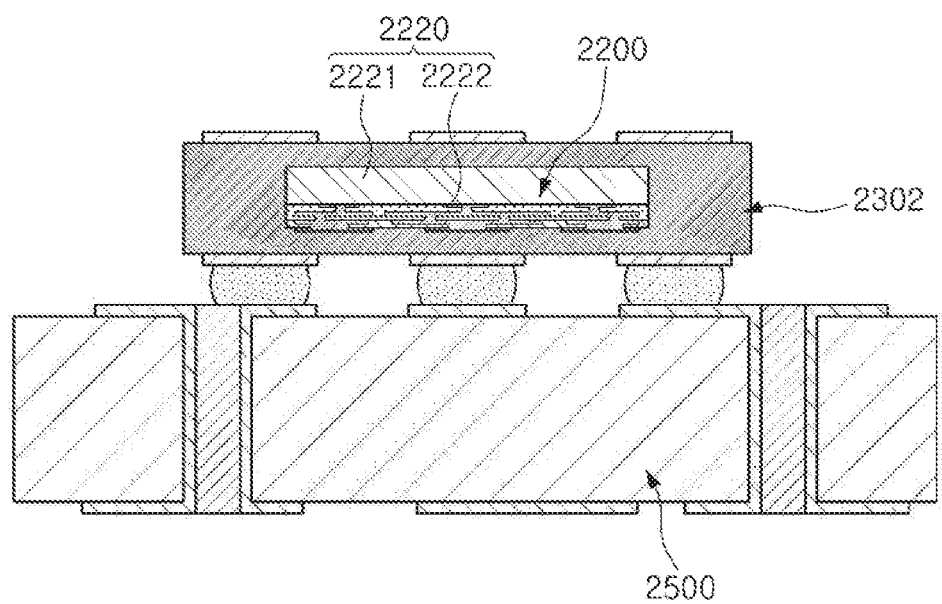
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may again be redistributed through an interposer substrate 2301, and the fan-in semiconductor package 2200 may be finally mounted on a main board 2500 of an electronic device in a state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may again be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
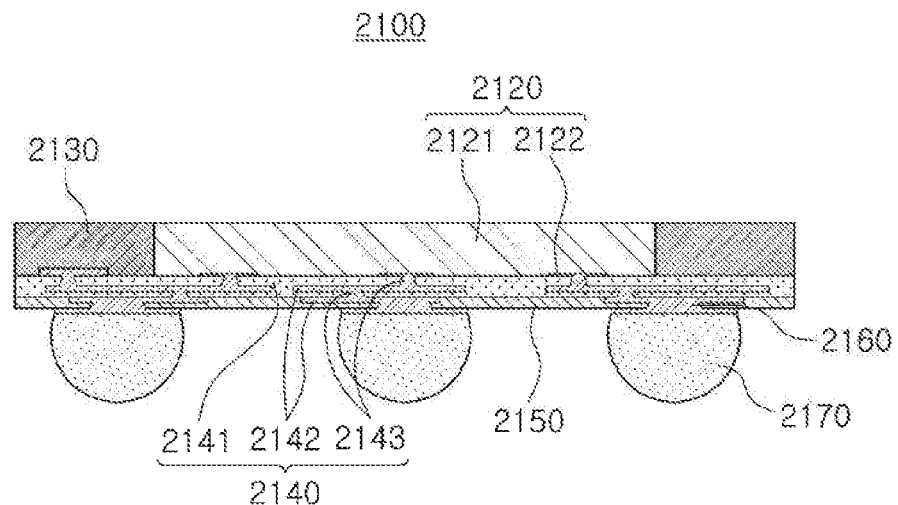
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may further be formed on the interconnection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor are redistributed and disposed outwardly of the semiconductor through the interconnection member formed on the semiconductor. As described above, in the fan-in semiconductor package, all I/O terminals of the semiconductor need to be disposed inside the semiconductor. Therefore, when a size of the semiconductor is reduced, a size and a pitch of balls need to be reduced, such that a standardized ball layout may not be used in the fan-in semiconductor package. On the other hand, the fan-out semiconductor package has the form in which the I/O terminals of the semiconductor are redistributed and disposed outwardly of the semiconductor through the interconnection member formed on the semiconductor as described above. Therefore, even in the case that a size of the semiconductor is reduced, a standardized ball layout may be used in the fan-out semiconductor package as it is, such that the fan-out semiconductor package may be mounted on the main board of the electronic device without using a separate interposer substrate, as described below.

Figure 8:
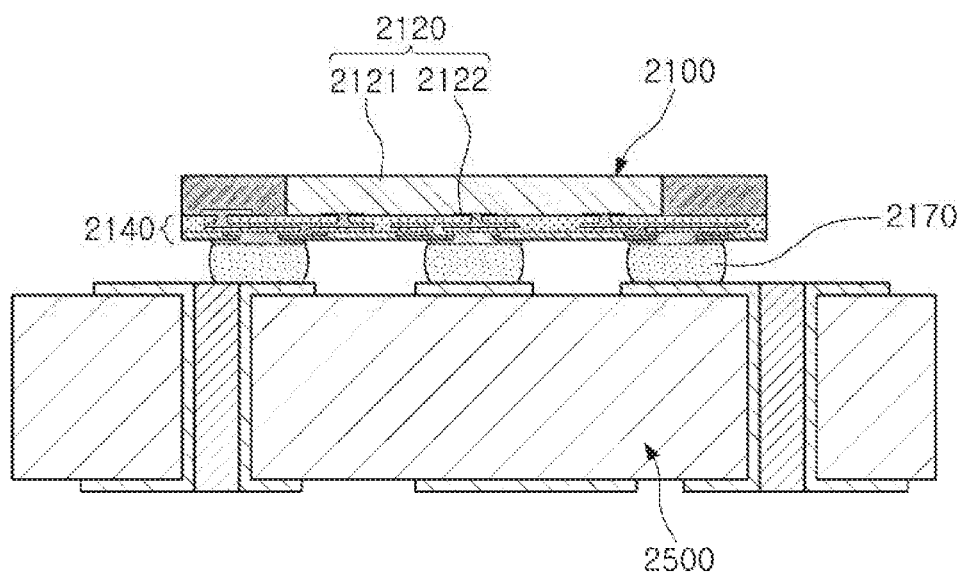
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor on the main board of the electronic device, or the like, as described above, and protecting the semiconductor from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out sensor package according to the present disclosure may be manufactured using the fan-out semiconductor package technology described above. A fan-out sensor package of which miniaturization and performance improvement are possible will hereinafter be described with reference to the drawings.

Figure 9:
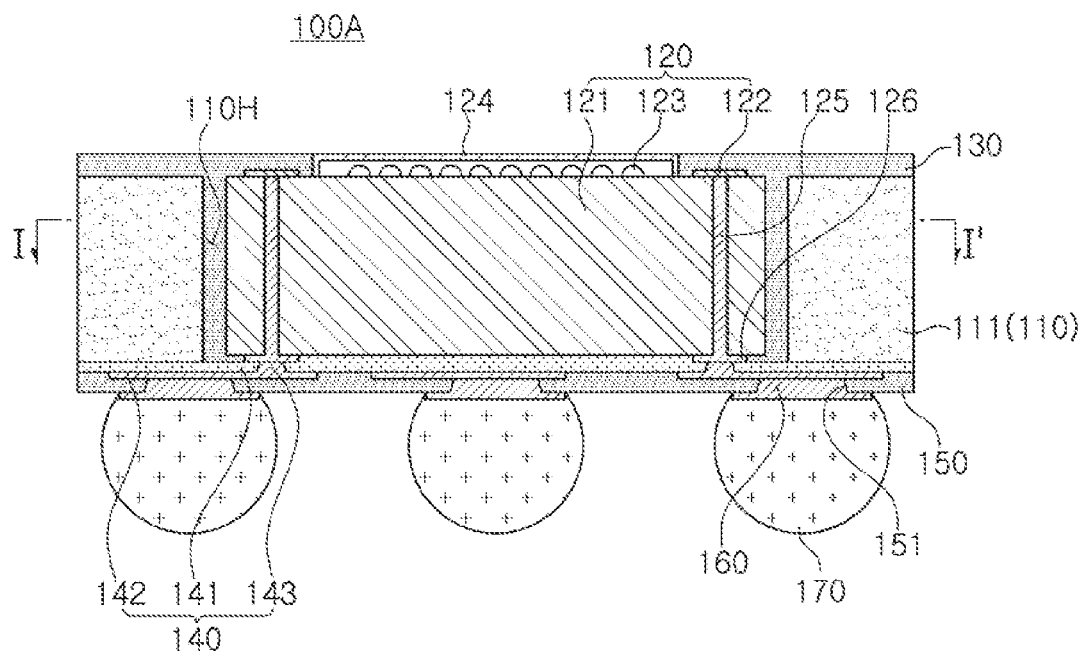
FIG. 9 is a schematic cross-sectional view illustrating an example of a fan-out sensor package.

FIG. 9 is a schematic cross-sectional view illustrating an example of a fan-out sensor package.

Figure 10:
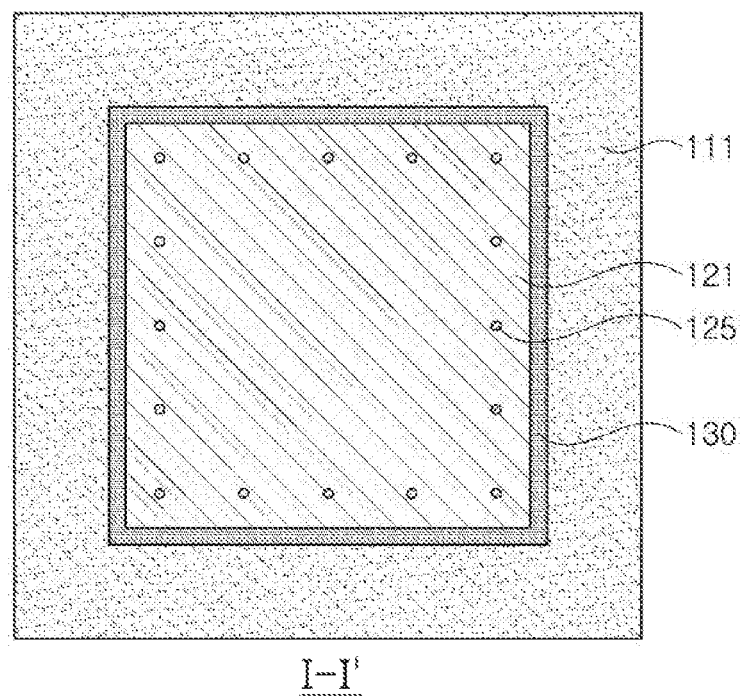
FIG. 10 is a schematic plan view taken along line I-I' of the fan-out sensor package of FIG. 9.

FIG. 10 is a schematic plan view taken along line I-I' of the fan-out sensor package of FIG. 9.

Referring to the drawings, a fan-out sensor package 100A according to an exemplary embodiment in the present disclosure may include a first interconnection member 110 having a through-hole 110H, a sensor 120 disposed in the through-hole 110H of the first interconnection member 110 and having an active surface having connection pads 122 and microlenses 123 disposed thereon and an inactive surface opposing the active surface, an encapsulant 130 encapsulating at least portions of the first interconnection member 110 and the active surface of the sensor 120, a second interconnection member 140 disposed on the first interconnection member 110 and the inactive surface of the sensor 120, a passivation layer 150 disposed on the second interconnection member 140, an underbump metal layer 160 formed in openings 151 of the passivation layer 150, and connection terminals 170 formed on the underbump metal layer 160. In this case, the second interconnection member 140 may include a redistribution layer 142 electrically connected to the connection pads 122 of the sensor 120. In detail, the connection pads 122 of the sensor 120 may be electrically connected to the redistribution layer 142 of the second interconnection member 140 through through-electrodes 125 penetrating through the sensor 120 and electrode pads 126 formed on the inactive surface of the sensor 120 and in contact with the through-electrodes 125.

In general, an image sensor package according to the related art has been manufactured by attaching an image sensor to a printed circuit board or a ceramic board using an adhesive, or the like, and interconnecting the image sensor and the printed circuit board using wire bonding technology. In the image sensor package having the structure described above, it may be difficult to reduce a thickness of the printed circuit board or the ceramic board, such that there may be a limitation in thinness of the image sensor package, and it may be difficult to sufficiently utilize a space due to the interconnection of the image sensor and the printed circuit board through the wire bonding technology, such that there may be a limitation in miniaturization and performance improvement of the image sensor package. In addition, a filter protecting microlenses of the image sensor is separately disposed on the image sensor in a module unit after the image sensor is attached to the board, such that the microlenses may be polluted by foreign materials in a process. In addition, the filter was manufactured depending on a size of the image sensor, such that there was a limitation in reducing a material cost.

On the other hand, in the fan-out sensor package 100A according to the exemplary embodiment, the first interconnection member 110 having the through-hole 110H may be introduced, the sensor 120 may be disposed in the through-hole 110H, the second interconnection member 140 including the redistribution layer 142 may be formed on the first interconnection member 110 and the inactive surface of the sensor 120 using a semiconductor process, or the like, and the connection pads 122 of the sensor 120 and the redistribution layer 142 of the second interconnection member 140 may be connected to each other using the through-electrodes 125. Therefore, miniaturization and thinness of the fan-out sensor package 100A may be promoted, and functions of the fan-out sensor package 100A may be improved due to a short signal path. In addition, a filter 124 protecting the microlenses 123 may be attached to the active surface of the sensor 120 before the sensor 120 is packaged, such that pollution of the microlenses 123 due to foreign materials in a process may be prevented, and the filter 124 may be manufactured to have a size smaller than that of the sensor 120, such that a material cost may be reduced.

The respective components included in the fan-out sensor package 100A according to the exemplary embodiment will hereinafter be described below in more detail.

The first interconnection member 110 may improve rigidity of the fan-out sensor package 100A depending on materials of the first interconnection member 110, and serve to secure uniformity of a thickness of the encapsulant 130. The first interconnection member 110 may have the through-hole 110H. The through-hole 110H may have the sensor 120 disposed therein to be spaced apart from the first interconnection member 110 by a predetermined distance. Side surfaces of the sensor 120 may be surrounded by the first interconnection member 110. However, such a form is only an example and may be variously modified to have other forms, and the fan-out sensor package 100A may perform another function depending on such a form.

A material of an insulating layer 111 constituting the first interconnection member 110 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated in an inorganic filler or a core material such as a glass fiber (or a glass cloth or a glass fabric), for example, prepreg, Ajinomoto Build up Film (ABF), FR-4, Bismaleimide Triazine (BT), or the like.

The sensor 120 may be an image sensor such as a complementary metal oxide semiconductor (CMOS) sensor, a charge coupled device (CCD) sensor, or the like, used in a camera module, or the like, but is not limited thereto. The sensor 120 may include a body 121, the connection pads 122, the microlenses 123, and the like. A base material of the body 121 may be silicon (Si), germanium (Ge), gallium arsenide (GaAs), or the like. Various circuits may be formed on the body 121. The connection pads 122 may electrically connect the sensor 120 to other components. A material of the connection pads 122 may be a conductive material such as aluminum (Al), or the like. The microlens 123 may be a known lens used in the image sensor. The active surface refers to a surface of the sensor 120 on which the connection pads 122 and the microlenses 123 are disposed, and the inactive surface refers to a surface opposing the active surface.

The filter 124 protecting the microlenses 123 may be disposed on the active surface of the sensor 120. The filter 124 may have a size sufficient to protect the microlenses 123 from foreign materials, and the like. That is, the filter 124 may have a size smaller than the sensor 120. The filter 124 may be a known infrared cut-off filter formed of a glass which blocks infrared light and allows visible light to pass through, but is not limited thereto. An upper surface of the filter 124 may be disposed on a level that is approximately the same as an upper surface of the encapsulant 130. The upper surface of the filter 124 may be externally exposed.

The connection pads 122 of the sensor 120 may be connected to the redistribution layer 142 of the second interconnection member 140 through the through-electrodes 125 penetrating through the sensor 120, the electrode pads 126 formed on the inactive surface of the sensor 120 and in contact with the through-electrodes 125, and vias 143 of the second interconnection member 140. Therefore, a signal may be transferred via a very short path. The through-electrode 125 may be a known through-silicon-via (TSV). The electrode pad 126 may be a conductive pattern including a known conductive material.

The encapsulant 130 may protect the first interconnection member 110, the sensor 120, and the like. An encapsulation form of the encapsulant 130 is not particularly limited, but may be a form in which the encapsulant 130 surrounds at least portions of the first interconnection member 110, the sensor 120, and the like. For example, the encapsulant 130 may cover the first interconnection member 110 and the active surface of the sensor 120, and fill spaces between walls of the through-hole 110H and the side surfaces of the sensor 120. Meanwhile, the encapsulant 130 may fill the through-hole 110H to thus serve as an adhesive and reduce buckling of the sensor 120 depending on materials of the encapsulant 130.

A material of the encapsulant 130 is not particularly limited. The material of the encapsulant 130 may be, for example, prepreg including an insulating resin, a core material, a filler, and the like, or may be ABF including an insulating resin and a filler. Alternatively, a known epoxy molding compound (EMC) may be used as the material of the encapsulant 130.

The second interconnection member 140 may redistribute the connection pads 122 of the sensor 120. Several tens to several hundreds of connection pads 122 having various functions may be redistributed by the second interconnection member 140, and may be physically or electrically connected to an external source through the connection terminals 170 depending on the functions. The second interconnection member 140 may include an insulating layer 141, the redistribution layer 142 disposed on the insulating layer 141, and vias 143 penetrating through the insulating layers 141 and connected to the redistribution layer 142. In the fan-out sensor package 100A according to the exemplary embodiment, the second interconnection member 140 may include a single layer, but is not limited thereto. That is, the second interconnection member 140 may also include a plurality of layers including a plurality of insulating layers, a plurality of redistribution layers, and a plurality of via layers depending on a design.

An insulating material may be used as a material of the insulating layers 141. In this case, a photosensitive insulating material such as a photoimagable dielectric (PID) resin may also be used as the insulating material. That is, the insulating layer 141 may be a photosensitive insulating layer. In a case in which the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may have various functions depending on designs of layers corresponding thereto. For example, the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may include a via pad, a connection terminal pad, and the like.

A surface treatment layer (not illustrated) may be formed on a surface of the exposed redistribution layer 142, if necessary. The surface treatment layer may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto.

The vias 143 may electrically connect the redistribution layers 142, the connection pads 122, or the like, formed on different layers, to each other, resulting in an electrical path in the fan-out sensor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. The via 143 may be entirely filled with the conductive material, or the conductive material may also be formed along a wall of the via. In addition, the via 143 may have all shapes known in the related art, such as a tapered shape, a cylindrical shape, and the like.

The passivation layer 150 may be additionally configured to protect the second interconnection member 140 from external physical or chemical damage. The passivation layer 150 may have the openings 151 exposing at least portions of the redistribution layer 142 of the second interconnection member 140. The number of openings 151 formed in the passivation layer 150 may be several tens to several thousands.

A material of the passivation layer 150 is not particularly limited. The material of the passivation layer 150 may be, for example, prepreg including an insulating resin, a core material, a filler, and the like, or may be ABF including an insulating resin and a filler. Alternatively, a known solder resist may be used as the material of the passivation layer 150.

The underbump metal layer 160 may be additionally configured to improve connection reliability of the connection terminals 170 to improve board level reliability of the fan-out sensor package 100A. The underbump metal layer 160 may be connected to the redistribution layer 142 of the second interconnection member 140 exposed through the openings 151 of the passivation layer 150. The underbump metal layer 160 may be formed in the openings 151 of the passivation layer 150 by a known metallization method using a known conductive metal such as a metal, but is not limited thereto.

The connection terminals 170 may be additionally configured to physically or electrically externally connect the fan-out sensor package 100A. For example, the fan-out sensor package 100A may be mounted on the main board of the electronic device through the connection terminals 170. Each of the connection terminals 170 may be formed of a conductive material, for example, a solder, or the like. However, this is only an example, and a material of each of the connection terminals 170 is not limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, interval, disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122, but are not limited thereto, and may also be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for the region in which the sensor 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a reduced thickness, and may have price competitiveness.

Meanwhile, although not illustrated in the drawings, a metal thin film may be formed on a wall of the through-hole 110H, if necessary, in order to dissipate heat or block electromagnetic waves. In addition, a plurality of sensors 120 performing functions that are the same as or different from each other may be disposed in the through-hole 110H.

In addition, another semiconductor chip such as an application specific integrated circuit (ASIC), or the like, may be disposed in the through-hole 110H. In addition, a separate surface mounted component may be mounted on a surface of the passivation layer 150.

Figure 11:
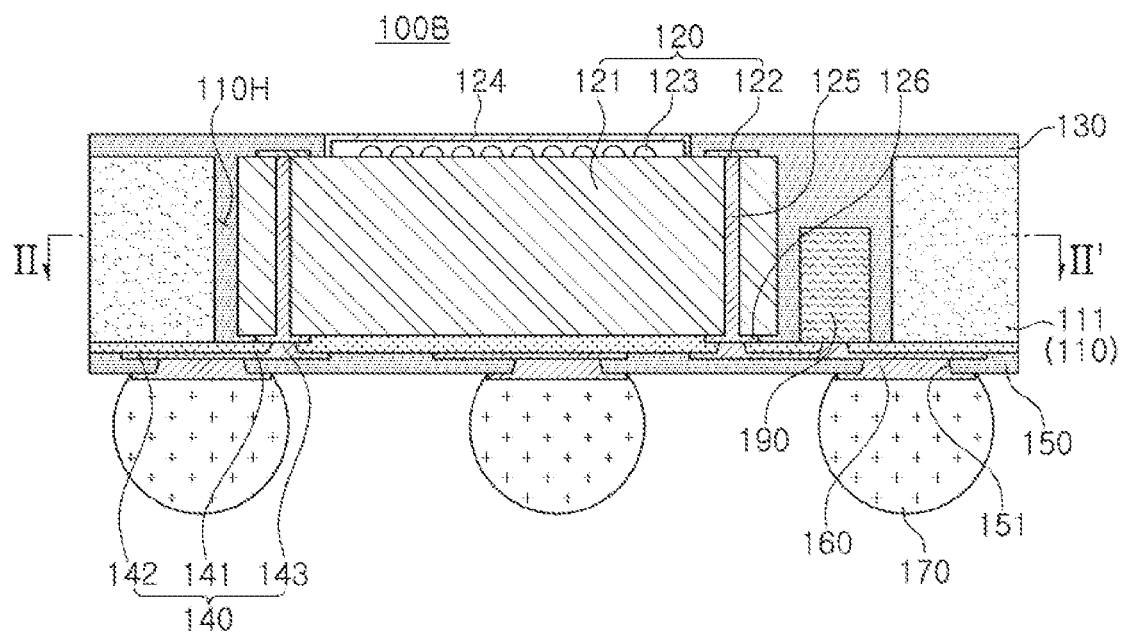
FIG. 11 is a schematic cross-sectional view illustrating another example of a fan-out sensor package.

FIG. 11 is a schematic cross-sectional view illustrating another example of a fan-out sensor package.

Figure 12:
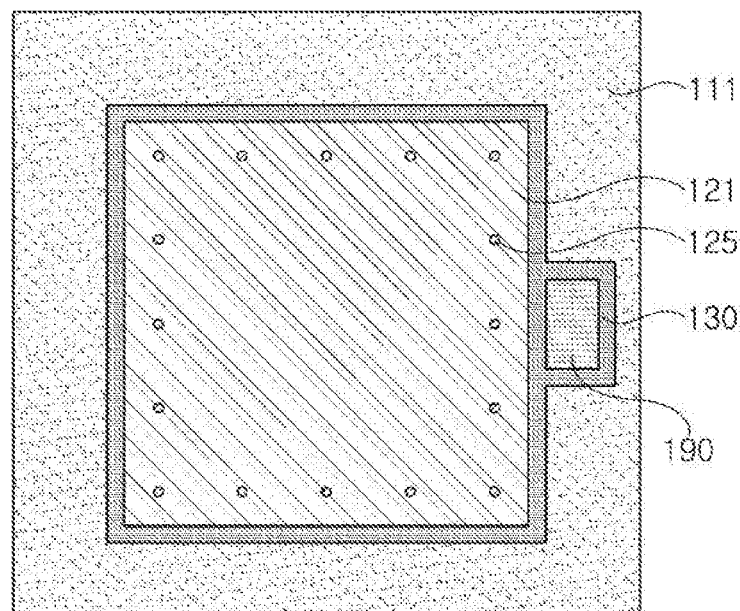
FIG. 12 is a schematic plan view taken along line II-II' of the fan-out sensor package of FIG. 11.

FIG. 12 is a schematic plan view taken along line II-II' of the fan-out sensor package of FIG. 11.

Referring to the drawings, a fan-out sensor package 100B according to another exemplary embodiment in the present disclosure may further include a passive component 190 disposed on a through-hole 110H. The passive component 190 may be a known passive component such as a capacitor, an inductor, or the like. One or more passive components 190 may be disposed together with a sensor 120 in the through-hole 110H. The passive component 190 may be electrically connected to a redistribution layer 142 of a second interconnection member 140. Therefore, the passive component 190 may also be electrically connected to connection pads 122 of the sensor 120.

A description, or the like, of configurations other than the abovementioned configuration may overlap the description provided above in the fan-out sensor package 100A, and is thus omitted.

Figure 13:
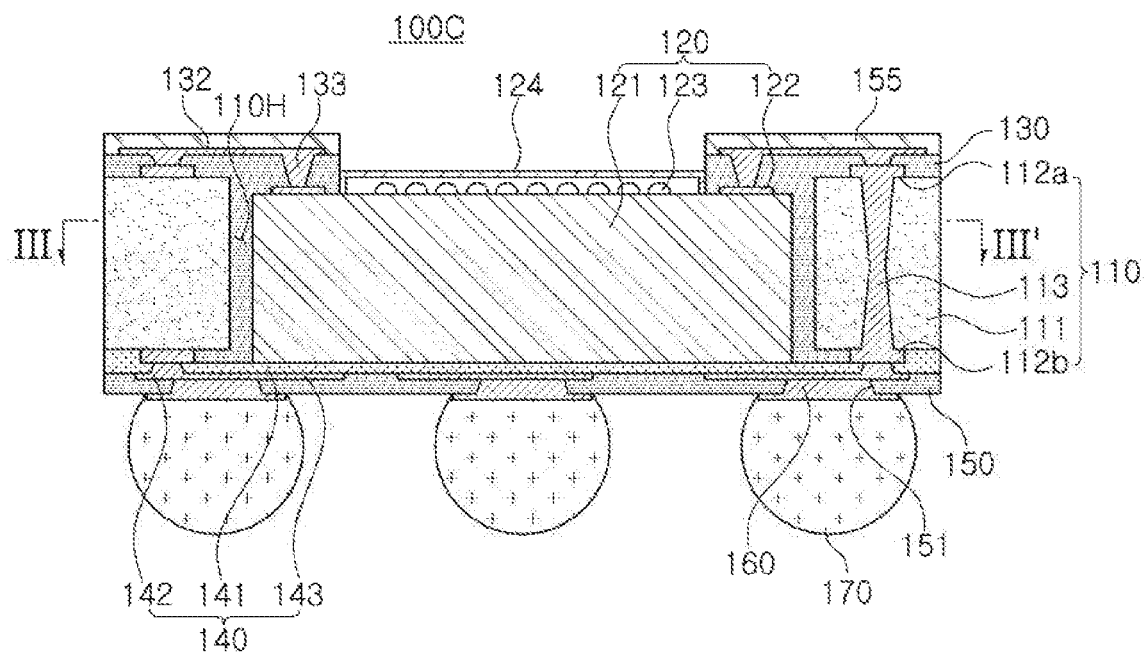
FIG. 13 is a schematic cross-sectional view illustrating another example of a fan-out sensor package.

FIG. 13 is a schematic cross-sectional view illustrating another example of a fan-out sensor package.

Figure 14:
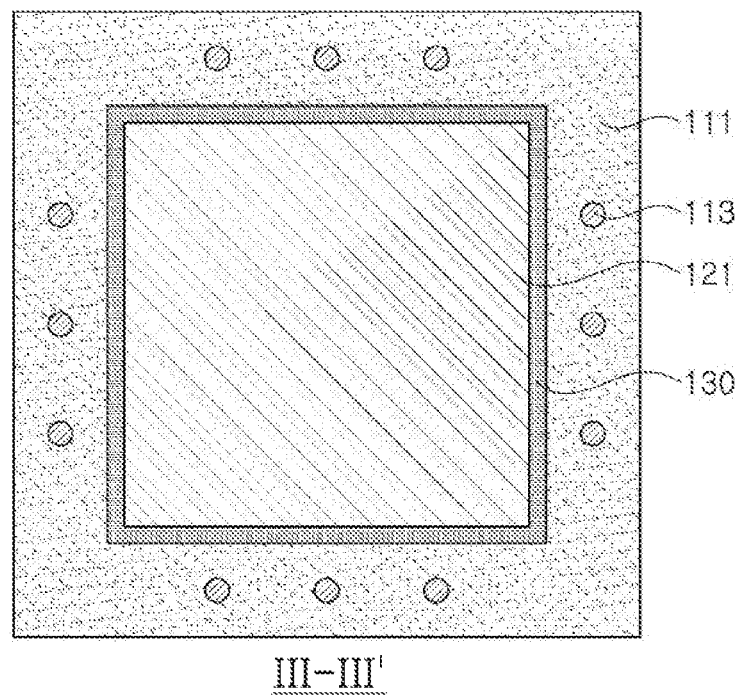
FIG. 14 is a schematic plan view taken along line III-III' of the fan-out sensor package of FIG. 13.

FIG. 14 is a schematic plan view taken along line III-III' of the fan-out sensor package of FIG. 13.

Referring to the drawings, a fan-out sensor package 100C according to another exemplary embodiment in the present disclosure may further include a rear redistribution layer 132 disposed on an encapsulant 130 and rear vias 133 penetrating through the encapsulant 130. In this case, a first interconnection member 110 may include an insulating layer 111, a first redistribution layer 112a disposed on one surface of the insulating layer 111 and connected to the rear vias 133, a second redistribution layer 112b disposed on the other surface of the insulating layer 111 and connected to vias 143 of a second interconnection member 140, and through-vias 113 penetrating through the insulating layer 111 and electrically connecting the first and second redistribution layers 112a and 112b to each other. Therefore, a redistribution layer 142 of the second interconnection member 140 may be electrically connected to connection pads 122 of a sensor 120 through the first interconnection member 110, the rear redistribution layer 132, and the rear vias 133.

The rear redistribution layer 132 may be formed of a conductive material such as copper (Cu), aluminum (Al), silver (Ag), tin (Sn), gold (Au), nickel (Ni), lead (Pb), titanium (Ti), or alloys thereof. The rear redistribution layer 132 may include a ground (GND) pattern, a power (PWR) pattern, a signal (S) pattern, and the like, depending on a design of its corresponding layer. In addition, the rear redistribution layers 132 may include a via pad, and the like.

The rear vias 133 may electrically connect the rear redistribution layer 132, the connection pads 122, the first redistribution layer 112a, and the like, formed on different layers to each other. A material of the rear via 133 may be a conductive material such as copper (Cu), aluminum (Al), silver (Ag), tin (Sn), gold (Au), nickel (Ni), lead (Pb), titanium (Ti), or alloys thereof. The rear via 133 may be entirely filled with the conductive material, or the conductive material may also be formed along a wall of the via. In addition, the rear via 133 may have all shapes known in the related art, such as a tapered shape, a cylindrical shape, and the like.

A material of the insulating layer 111 constituting the first interconnection member 110 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated in an inorganic filler or a core material such as a glass fiber (or a glass cloth or a glass fabric), for example, prepreg, ABF, FR-4, BT, or the like.

The redistribution layers 112a and 112b may serve to redistribute the connection pads 122. A material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may have various functions depending on designs of layers corresponding thereto. For example, the redistribution layers 112a and 112b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may include a via pad, a connection terminal pad, and the like.

The through-vias 113 may electrically connect the redistribution layers 112a and 112b formed on different layers to each other. A material of each of the through-vias 113 may be a conductive material such as copper (Cu), aluminum (Al), silver (Ag), tin (Sn), gold (Au), nickel (Ni), lead (Pb), titanium (Ti), or alloys thereof. The through-via 113 may be entirely filled with the conductive material, or the conductive material may also be formed along a wall of the through-via. In addition, the through-via 113 may have all shapes known in the related art, such as an hourglass shape, a cylindrical shape, and the like.

Meanwhile, the fan-out sensor package 100C according to another exemplary embodiment may further include a passivation layer 155 disposed on the encapsulant 130 and covering the rear redistribution layer 132. The passivation layer 155 may be formed of a material that is substantially the same as that of the passivation layer 150 described above, and may reduce warpage through a symmetry effect with the passivation layer 150. Also in this case, a filter 124 may be externally exposed. An upper surface of the filter 124 may be disposed on a level that is approximately the same as an upper surface of the first redistribution layer 112a of the first interconnection member 110, but is not limited thereto.

A description, or the like, of configurations other than the abovementioned configuration may overlap the description provided above in the fan-out sensor package 100A, and is thus omitted. Meanwhile, the respective features of the fan-out sensor packages 100A to 100C described above may be combined with one another.

Figure 15:
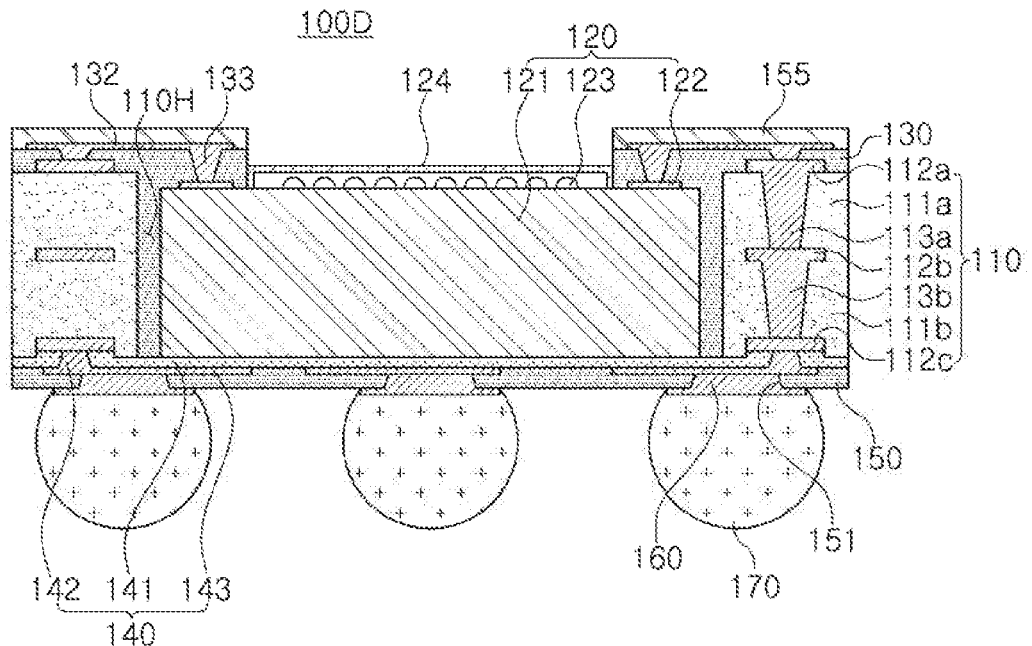
FIG. 15 is a schematic cross-sectional view illustrating another example of a fan-out sensor package.

FIG. 15 is a schematic cross-sectional view illustrating another example of a fan-out sensor package.

Referring to the drawing, in a fan-out sensor package 100D according to another exemplary in the present disclosure, a first interconnection member 110 may include redistribution layers 112a, 112b, and 112c electrically connected to connection pads 122 of a sensor 120. In detail, the first interconnection member 110 may include a first insulating layer 111a, a first redistribution layer 112a disposed on the first insulating layer 111a and connected to rear vias 133, a second redistribution layer 112b embedded in the other surface of the first insulating layer 111a opposing one surface of the first insulating layer 111a on which the first redistribution layer 112a is disposed, a second insulating layer 111b disposed on the other surface of the first insulating layer 111a in which the second redistribution layer 112b is embedded, a third redistribution layer 112c embedded in the other surface of the second insulating layer 111b opposing one surface of the second insulating layer 111b on which the second redistribution layer 112b is disposed and connected to vias 143 of a second interconnection member 140, first vias 113a penetrating through the first insulating layer 111a and electrically connecting the first redistribution layer 112a and the second redistribution layer 112b to each other, and second vias 113b penetrating through the second insulating layer 111b and electrically connecting the second redistribution layer 112b and the third redistribution layer 112c to each other. As described above, the first interconnection member 110 may include a larger number of redistribution layers 112a, 112b, and 112c and the number of layers of the second interconnection member 140 may thus be significantly reduced. Resultantly, the fan-out sensor package 100D may be more easily thinned and miniaturized.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is impregnated in an inorganic filler or a core material such as a glass fiber (or a glass cloth or a glass fabric), for example, prepreg, ABF, FR-4, BT, or the like. Alternatively, a photoimagable dielectric (PID) resin may also be used as the insulating material.

The redistribution layers 112a, 112b, and 112c may serve to redistribute the connection pads 122 of the sensor 120. A material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may have various functions depending on designs of layers corresponding thereto. For example, the redistribution layers 112a, 112b, and 112c may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a, 112b, and 112c may include a via pad, a connection terminal pad, and the like.

The vias 113a and 113b may electrically connect the redistribution layers 112a, 112b, and 112c formed on different layers to each other, resulting in an electrical path in the first interconnection member 110. A material of each of the vias 113a and 113b may be a conductive material. Each of the vias 113a and 113b may be entirely filled with the conductive material, or the conductive material may also be formed along a wall of respective via holes. In addition, each of the vias 113a and 113b may have all shapes known in the related art, such as a tapered shape, a cylindrical shape, and the like.

The third redistribution layer 112c may be recessed in the second insulating layer 111b, such that a lower surface of the second insulating layer 111b and a lower surface of the third redistribution layer 112c have a step therebetween. Resultantly, when an encapsulant 130 is formed, a phenomenon in which a material of the encapsulant 130 bleeds to pollute the third redistribution layer 112c may be prevented. The second redistribution layer 112b of the first interconnection member 110 may be disposed on a level between an active surface and an inactive surface of the sensor 120. The first interconnection member 110 may be formed to have a thickness corresponding to that of the sensor 120. Therefore, the second redistribution layer 112b formed in the first interconnection member 110 may be disposed on a level between the active surface and the inactive surface of the sensor 120. Thicknesses of the redistribution layers 112a, 112b, and 112c of the first interconnection member 110 may be greater than that of the redistribution layer 142 of the second interconnection member 140. Since the first interconnection member 110 may have a thickness equal to or greater than that of the sensor 120, the redistribution layers 112a, 112b, and 112c may be formed to have large sizes depending on a scale of the first interconnection member 110. On the other hand, the redistribution layer 142 of the second interconnection member 140 may be formed to have a relatively small size for thinness.

A description, or the like, of configurations other than the abovementioned configuration overlaps those described above in the fan-out sensor package 100A and the fan-out sensor package 100C, and is thus omitted. Meanwhile, the respective features of the fan-out sensor packages 100A to 100D described above may be combined with one another.

Figure 16:
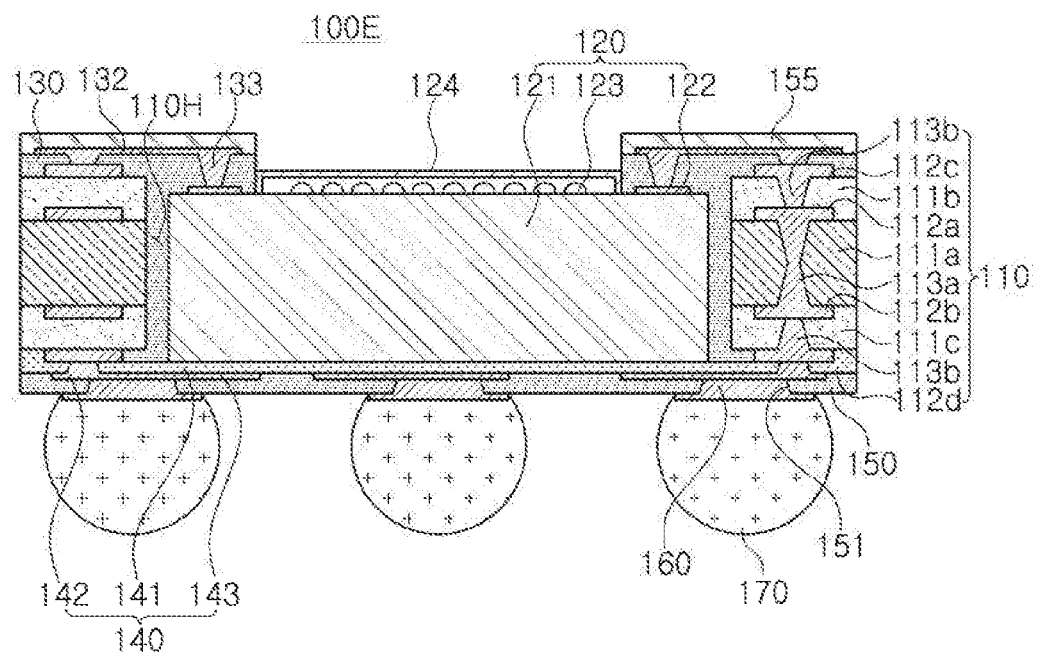
FIG. 16 is a schematic cross-sectional view illustrating another example of a fan-out sensor package.

FIG. 16 is a schematic cross-sectional view illustrating another example of a fan-out sensor package.

Referring to the drawing, in a fan-out sensor package 100E according to another exemplary in the present disclosure, a first interconnection member 110 may include redistribution layers 112a, 112b, 112c, and 112d electrically connected to connection pads 122 of a sensor 120. In detail, the first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b and connected to rear vias 133, a third insulating layer 111c disposed on the first insulating layer 111a and covering the second redistribution layer 112b, a fourth redistribution layer 112d disposed on the third insulating layer 111c and connected to vias 143 of a second interconnection member 140, first vias 113a penetrating through the first insulating layer 111a and electrically connecting the first redistribution layer 112a and the second redistribution layer 112b to each other, second vias 113b penetrating through the second insulating layer 111b and electrically connecting the first redistribution layer 112a and the third redistribution layer 112c to each other, and third vias 113c penetrating through the third insulating layer 111c and electrically connecting the second redistribution layer 112b and the fourth redistribution layer 112d to each other. As described above, the first interconnection member 110 may include a larger number of redistribution layers 112a, 112b, 112c, and 112d, and the number of layers of the second interconnection member 140 may thus be significantly reduced. Resultantly, the fan-out sensor package 100E may be more easily thinned and miniaturized.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111*a* may include an insulating material different from those of the second insulating layer 111*b* and the third insulating layer 111*c*. For example, the first insulating layer 111*a* may be, for example, prepreg including a core material, an inorganic filler, and an insulating resin, and the second insulating layer 111*b* and the third insulating layer 111*c* may be an ABF or a photosensitive insulating film including an inorganic filler and an insulating resin. However, the materials of the first insulating layer 111*a* and the second and third insulating layers 111*b* and 111*c* are not limited thereto.

The redistribution layers 112*a*, 112*b*, 112*c*, and 112*d* may serve to redistribute the connection pads 122 of the sensor 120. A material of each of the redistribution layers 112*a*, 112*b*, 112*c*, and 112*d* may be a conductive material such as copper (Cu), aluminum (Al), silver (Ag), tin (Sn), gold (Au), nickel (Ni), lead (Pb), titanium (Ti), or alloys thereof. The redistribution layers 112*a*, 112*b*, 112*c*, and 112*d* may have various functions depending on designs of layers corresponding thereto. For example, the redistribution layers 112*a*, 112*b*, 112*c*, and 112*d* may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112*a*, 112*b*, 112*c*, and 112*d* may include a via pad, a connection terminal pad, and the like.

The vias 113*a*, 113*b*, and 113*c* may electrically connect the redistribution layers 112*a*, 112*b*, and 112*c* formed on different layers to each other, resulting in an electrical path in the first interconnection member 110. A material of each of the vias 113*a*, 113*b*, and 113*c* may be a conductive material. Each of the vias 113*a*, 113*b*, and 113*c* may be entirely filled with the conductive material, or the conductive material may also be formed along a wall of respective via holes. In addition, each of the vias 113*a*, 113*b*, and 113*c* may have all shapes known in the related art, such as a tapered shape, a cylindrical shape, and the like. Meanwhile, the first via 113*a* may have a diameter greater than those of the second via 113*b* and the third via 113*c*. Here, the first insulating layer 111*a* may have a thickness greater than those of the second insulating layer 111*b* and the third insulating layer 111*c*. For example, the first via 113*a* may be a through-via, and the second via 113*b* and the third via 113*c* may be blind vias. However, the first to third vias 113*a* to 113*c* are not limited thereto.

The first redistribution layer 112*a* and the second redistribution layer 112*b* of the first interconnection member 110 may be disposed on a level between an active surface and an inactive surface of the sensor 120. The first interconnection member 110 may be formed to a thickness corresponding to that of the sensor 120. Therefore, the first redistribution layer 112*a* and the second redistribution layer 112*b* formed in the first interconnection member 110 may be disposed on a level between the active surface and the inactive surface of the sensor 120. Thicknesses of the redistribution layers 112*a*, 112*b*, 112*c*, and 112*d* of the first interconnection member 110 may be greater than those of the redistribution layers 142*a* and 142*b* of the second interconnection member 140. Since the first interconnection member 110 may have a thickness equal to or greater than that of the sensor 120, the redistribution layers 112*a*, 112*b*, 112*c*, and 112*d* may also be formed to have large sizes. On the other hand, the redistribution layers 142*a* and 142*b* of the second interconnection member 140 may be formed to be relatively small for thinness.

A description, or the like, of configurations other than the abovementioned configuration overlaps those described above in the fan-out sensor package 100A and the fan-out sensor package 100C, and is thus omitted. Meanwhile, the respective features of the fan-out sensor packages 100A to 100E described above may be combined with one another.

Figure 17:
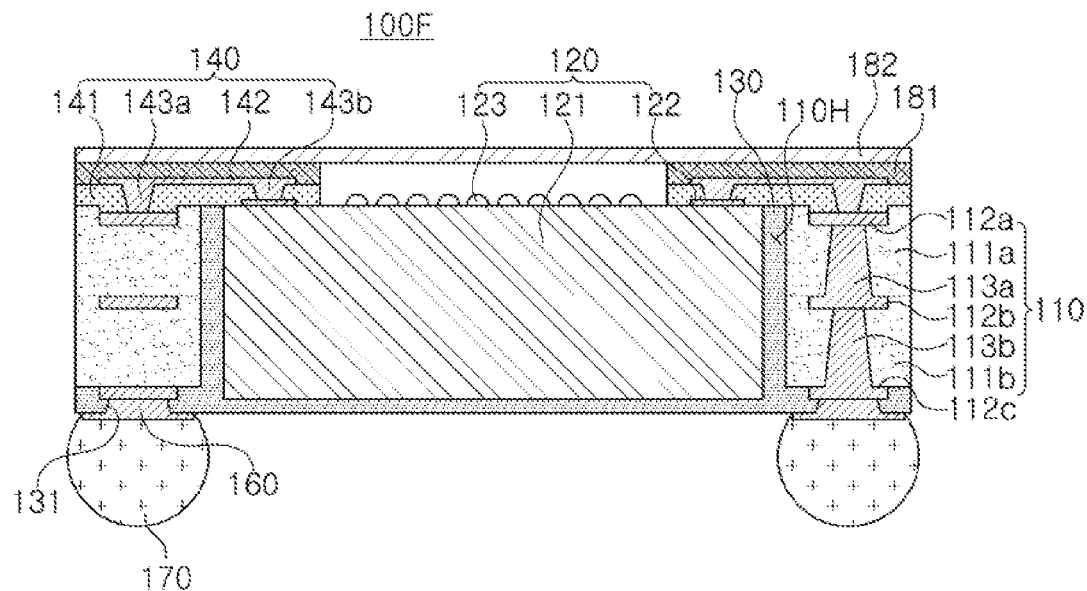
FIG. 17 is a schematic cross-sectional view illustrating another example of a fan-out sensor package.

FIG. 17 is a schematic cross-sectional view illustrating another example of a fan-out sensor package.

Referring to the drawing, in a fan-out sensor package 100F according to another exemplary embodiment in the present disclosure, an encapsulant 130 may encapsulate at least portions of a first interconnection member 110 and an inactive surface of a sensor 120. In addition, a second interconnection member 140 may be disposed on the first interconnection member 110 and an active surface of the sensor 120. In this case, the first interconnection member 110 may include redistribution layers 112*a*, 112*b*, and 112*c* electrically connected to the connection pads 122 of the sensor 120. In addition, the second interconnection member 140 may include a redistribution layer 142 electrically connected to the connection pads 122 of the sensor 120. Meanwhile, at least one 112*b* of the redistribution layers 112*a*, 112*b*, and 112*c* of the first interconnection member 110 may be disposed on a level between the active surface and the inactive surface of the sensor 120. As described above, the second interconnection member 140 may be disposed on the active surface of the sensor 120, and the connection pads 122 may thus be redistributed through a short signal path, the first interconnection member 110 may include a larger number of redistribution layers 112*a*, 112*b*, and 112*c*, and the number of layers of the second interconnection member 140 may thus be significantly reduced, and a redistribution layer may be omitted from the inactive surface of the sensor 120, and the fan-out sensor package 100F may thus be further thinned and miniaturized while having the same function.

The first interconnection member 110 may include a first insulating layer 111*a* in contact with the second interconnection member 140, a first redistribution layer 112*a* in contact with the second interconnection member 140 and embedded in the first insulating layer 111*a*, a second redistribution layer 112*b* disposed on the other surface of the first insulating layer 111*a* opposing one surface of the first insulating layer 111*a* in which the first redistribution layer 112*a* is embedded, a second insulating layer 111*b* disposed on the first insulating layer 111*a* and covering the second redistribution layer 112*b*, and a third redistribution layer 112*c* disposed on the second insulating layer 111*b*. The first to third redistribution layers 112*a*, 112*b*, and 112*c* may be electrically connected to the connection pads 122. The first and second redistribution layers 112*a* and 112*b* may be electrically connected to each other by a first via 113*a* penetrating through the first insulating layer 111*a*, and the second and third redistribution layers 112*b* and 112*c* may be electrically connected to each other by a second via 113*b* penetrating through the second insulating layer 111*b*.

A material of each of the insulating layers 111*a* and 111*b* is not particularly limited. For example, an insulating material may be used as the material of each of the insulating layers 111*a* and 111*b*. In this case, the insulating material may be a thermosetting resin such as an epoxy resin, a thermoplastic resin such as a polyimide resin, a resin in which the thermosetting resin or the thermoplastic resin is impregnated in an inorganic filler or a core material such as a glass fiber (or a glass cloth or a glass fabric), for example, prepreg, ABF, FR-4, BT, or the like. Alternatively, a photoimagable dielectric (PID) resin may also be used as the insulating material.

The redistribution layers 112a, 112b, and 112c may serve to redistribute the connection pads 122 of the sensor 120. A material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may have various functions depending on designs of layers corresponding thereto. For example, the redistribution layers 112a, 112b, and 112c may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a, 112b, and 112c may include a via pad, a connection terminal pad, and the like.

The vias 113a and 113b may electrically connect the redistribution layers 112a, 112b, and 112c formed on different layers to each other, resulting in an electrical path in the first interconnection member 110. A material of each of the vias 113a and 113b may be a conductive material. Each of the vias 113a and 113b may be entirely filled with the conductive material, or the conductive material may also be formed along a wall of respective via holes. In addition, each of the vias 113a and 113b may have all shapes known in the related art, such as a tapered shape, a cylindrical shape, and the like.

The first redistribution layer 112a may be recessed into the first insulating layer 111a, such that an upper surface of the first insulating layer 111a and an upper surface of the first redistribution layer 112a have a step therebetween. Resultantly, when an encapsulant 130 is formed, a phenomenon in which a material of the encapsulant 130 bleeds to pollute the first redistribution layer 112a may be prevented. The second redistribution layer 112b of the first interconnection member 110 may be disposed on a level between the active surface and the inactive surface of the sensor 120. The first interconnection member 110 may be formed to a thickness corresponding to that of the sensor 120. Therefore, the second redistribution layer 112b formed in the first interconnection member 110 may be disposed on a level between the active surface and the inactive surface of the sensor 120. Thicknesses of the redistribution layers 112a, 112b, and 112c of the first interconnection member 110 may be greater than that of the redistribution layer 142 of the second interconnection member 140. Since the first interconnection member 110 may have a thickness equal to or greater than that of the sensor 120, the redistribution layers 112a, 112b, and 112c may be formed to be large depending on a scale of the first interconnection member 110. On the other hand, the redistribution layer 142 of the second interconnection member 140 may be formed to be relatively small for thinness.

The second interconnection member 140 may include an insulating layer 141 disposed on the first interconnection member 110 and the active surface of the sensor 120, the redistribution layer 142 disposed on the insulating layer 141, and vias 143a and 143b penetrating through the insulating layer 141 and connecting the redistribution layer 142 to the first redistribution layer 112a of the first interconnection member 110 and/or the connection pads 122 of the sensor 120. That is, the first interconnection member 110 may be electrically connected to the connection pads 122 of the sensor 120 through the second interconnection member 140.

The insulating layer 141 may be a transparent photosensitive insulating layer. Materials of the transparent photosensitive insulating layer are not particularly limited, but may be known materials.

The redistribution layer 142 may serve to redistribute the connection pads 122 of the sensor 120, and may serve to electrically connect the first interconnection member 110 and the connection pads 122 of the sensor 120 to each other. A material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may include a ground (GND) pattern, a power (PWR) pattern, a signal (S) pattern, and the like, and may include a via pad, and the like.

The via 143b may electrically connect to the redistribution layer 142 and the connection pads 122 to each other. The via 143a may electrically connect the redistribution layers 112a and 142 formed on different layers to each other. A material of each of the vias 143a and 143b may be a conductive material. Each of the vias 143a and 143b may be entirely filled with the conductive material, or the conductive material may also be formed along a wall of respective via holes. In addition, each of the vias 143a and 143b may have all shapes known in the related art, such as a tapered shape, a cylindrical shape, and the like.

Meanwhile, in the fan-out sensor package 100F according to another exemplary embodiment, an underbump metal layer 160 may be disposed on openings 131 penetrating through the encapsulant 130 and exposing at least portions of the third redistribution layer 112c of the first interconnection member 110. In addition, connection terminals 170 may be disposed on an underbump metal layer 160. As described above, the underbump metal layer 160 and the connection terminals 170 may be formed on the first interconnection member 110 without using a separate redistribution layer, and the fan-out sensor package 100F may thus be further thinned and miniaturized.

Meanwhile, the fan-out sensor package 100F according to another exemplary embodiment may further include a passivation layer 181 disposed on the second interconnection member 140. The passivation layer 181 may also be a transparent photosensitive insulating layer. In addition, the fan-out sensor package 100F according to another exemplary embodiment may further include an infrared cut-off filter layer 182 disposed on the passivation layer 181. The infrared cut-off filter layer 182 may be formed before the underbump metal layer 160 and the connection terminals 170 are formed. Therefore, introduction of foreign materials into the active surface of the sensor 120 in a process may be prevented. The infrared cut-off filter layer 182 may be the infrared cut-off filter layer formed of a glass.

A description, or the like, of configurations other than the abovementioned configuration may overlap the description provided above in the fan-out sensor package 100A, and is thus omitted. Meanwhile, the respective features of the fan-out sensor packages 100A to 100F described above may be combined with one another.

Figure 18:
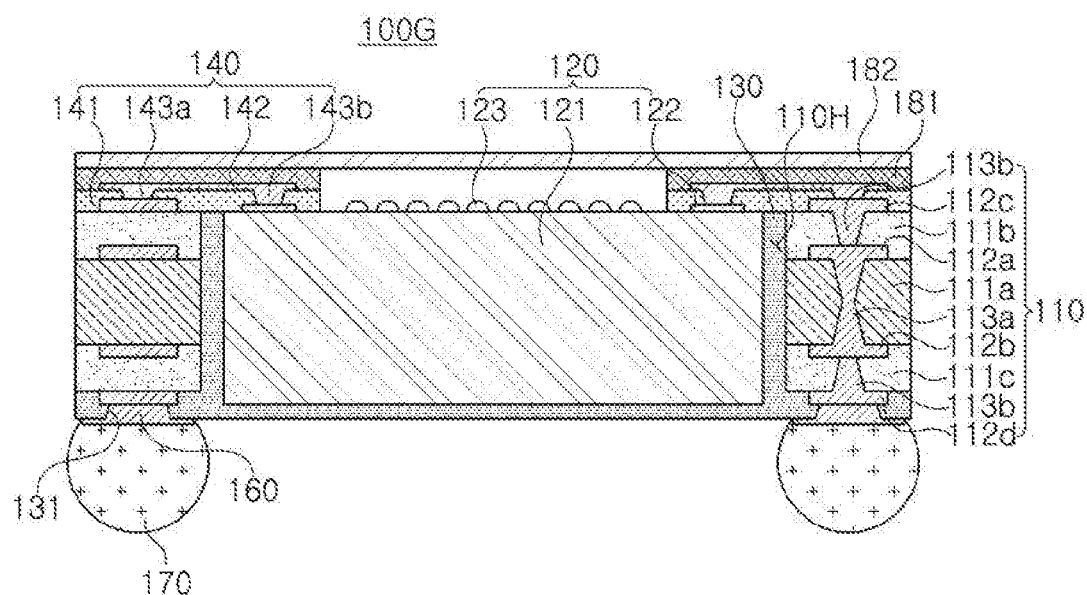
FIG. 18 is a schematic cross-sectional view illustrating another example of a fan-out sensor package.

FIG. 18 is a schematic cross-sectional view illustrating another example of a fan-out sensor package.

Referring to the drawing, in a fan-out sensor package 100G according to another exemplary embodiment in the present disclosure, an encapsulant 130 may encapsulate at least portions of a first interconnection member 110 and an inactive surface of a sensor 120. In addition, a second interconnection member 140 may be disposed on the first interconnection member 110 and an active surface of the sensor 120. In this case, the first interconnection member 110 may include redistribution layers 112*a*, 112*b*, 112*c*, and 112*d* electrically connected to connection pads 122 of the sensor 120. In addition, the second interconnection member 140 may include a redistribution layer 142 electrically connected to the connection pads 122 of the sensor 120. Meanwhile, one or more 112*a* and 112*b* of the redistribution layers 112*a*, 112*b*, 112*c*, and 112*d* of the first interconnection member 110 may be disposed on a level between the active surface and the inactive surface of the sensor 120. As described above, the second interconnection member 140 may be disposed on the active surface of the sensor 120, and the connection pads 122 may thus be redistributed through a short signal path, the first interconnection member 110 may include a larger number of redistribution layers 112*a*, 112*b*, 112*c*, and 112*d*, and the number of layers of the second interconnection member 140 may thus be significantly reduced, and a redistribution layer may be omitted from the inactive surface of the sensor 120, and the fan-out sensor package 100G may thus be further thinned and miniaturized while having the same function, as described above.

The first interconnection member 110 may include a first insulating layer 111*a*, a first redistribution layer 112*a* and a second redistribution layer 112*b* disposed on opposite surfaces of the first insulating layer 111*a*, respectively, a second insulating layer 111*b* disposed on the first insulating layer 111*a* and covering the first redistribution layer 112*a*, a third redistribution layer 112*c* disposed on the second insulating layer 111*b*, a third insulating layer 111*c* disposed on the first insulating layer 111*a* and covering the second redistribution layer 112*b*, and a fourth redistribution layer 112*d* disposed on the third insulating layer 111*c*. The first to fourth redistribution layers 112*a*, 112*b*, 112*c*, and 112*d* may be electrically connected to the connection pads 122. Since the first interconnection member 110 may include a larger number of redistribution layers 112*a*, 112*b*, 112*c*, and 112*d*, the second interconnection member 140 may be further simplified. Therefore, a decrease in a yield depending on a defect occurring in a process of forming the second interconnection member 140 may be improved. The first to fourth redistribution layers 112*a*, 112*b*, 112*c*, and 112*d* may be electrically connected to each other by first to third vias 113*a*, 113*b*, and 113*c* each penetrating through the first to third insulating layers 111*a*, 111*b*, and 111*c*.

The first insulating layer 111*a* may have a thickness greater than those of the second insulating layer 111*b* and the third insulating layer 111*c*. The first insulating layer 111*a* may be relatively thick in order to maintain rigidity, and the second insulating layer 111*b* and the third insulating layer 111*c* may be introduced in order to form a larger number of redistribution layers 112*c* and 112*d*. The first insulating layer 111*a* may include an insulating material different from those of the second insulating layer 111*b* and the third insulating layer 111*c*. For example, the first insulating layer 111*a* may be, for example, prepreg including a core material, an inorganic filler, and an insulating resin, and the second insulating layer 111*b* and the third insulating layer 111*c* may be an ABF or a photosensitive insulating film including an inorganic filler and an insulating resin. However, the materials of the first insulating layer 111*a* and the second and third insulating layers 111*b* and 111*c* are not limited thereto.

The redistribution layers 112*a*, 112*b*, 112*c*, and 112*d* may serve to redistribute the connection pads 122 of the sensor 120. A material of each of the redistribution layers 112*a*, 112*b*, 112*c*, and 112*d* may be a conductive material such as copper (Cu), aluminum (Al), silver (Ag), tin (Sn), gold (Au), nickel (Ni), lead (Pb), titanium (Ti), or alloys thereof. The redistribution layers 112*a*, 112*b*, 112*c*, and 112*d* may have various functions depending on designs of layers corresponding thereto. For example, the redistribution layers 112*a*, 112*b*, 112*c*, and 112*d* may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112*a*, 112*b*, 112*c*, and 112*d* may include a via pad, a connection terminal pad, and the like.

The vias 113*a*, 113*b*, and 113*c* may electrically connect the redistribution layers 112*a*, 112*b*, and 112*c* formed on different layers to each other, resulting in an electrical path in the first interconnection member 110. A material of each of the vias 113*a*, 113*b*, and 113*c* may be a conductive material. Each of the vias 113*a*, 113*b*, and 113*c* may be entirely filled with the conductive material, or the conductive material may also be formed along a wall of respective via holes. In addition, each of the vias 113*a*, 113*b*, and 113*c* may have all shapes known in the related art, such as a tapered shape, a cylindrical shape, and the like. Meanwhile, the first via 113*a* may have a diameter greater than those of the second via 113*b* and the third via 113*c*. Here, the first insulating layer 111*a* may have a thickness greater than those of the second insulating layer 111*b* and the third insulating layer 111*c*. For example, the first via 113*a* may be a through-via, and the second via 113*b* and the third via 113*c* may be blind vias. However, the first to third vias 113*a* to 113*c* are not limited thereto.

The first redistribution layer 112*a* and the second redistribution layer 112*b* of the first interconnection member 110 may be disposed on a level between the active surface and the inactive surface of the sensor 120. The first interconnection member 110 may be formed to a thickness corresponding to that of the sensor 120. Therefore, the first redistribution layer 112*a* and the second redistribution layer 112*b* formed in the first interconnection member 110 may be disposed on a level between the active surface and the inactive surface of the sensor 120. Thicknesses of the redistribution layers 112*a*, 112*b*, 112*c*, and 112*d* of the first interconnection member 110 may be greater than those of the redistribution layers 142*a* and 142*b* of the second interconnection member 140. Since the first interconnection member 110 may have a thickness equal to or greater than that of the sensor 120, the redistribution layers 112*a*, 112*b*, 112*c*, and 112*d* may also be formed to have large sizes. On the other hand, the redistribution layers 142*a* and 142*b* of the second interconnection member 140 may be formed to be relatively small for thinness.

A description, or the like, of configurations other than the abovementioned configuration overlaps those described above in the fan-out sensor package 100A and the fan-out sensor package 100F, and is thus omitted. Meanwhile, the respective features of the fan-out sensor packages 100A to 100G described above may be combined with one another.

Figure 19:
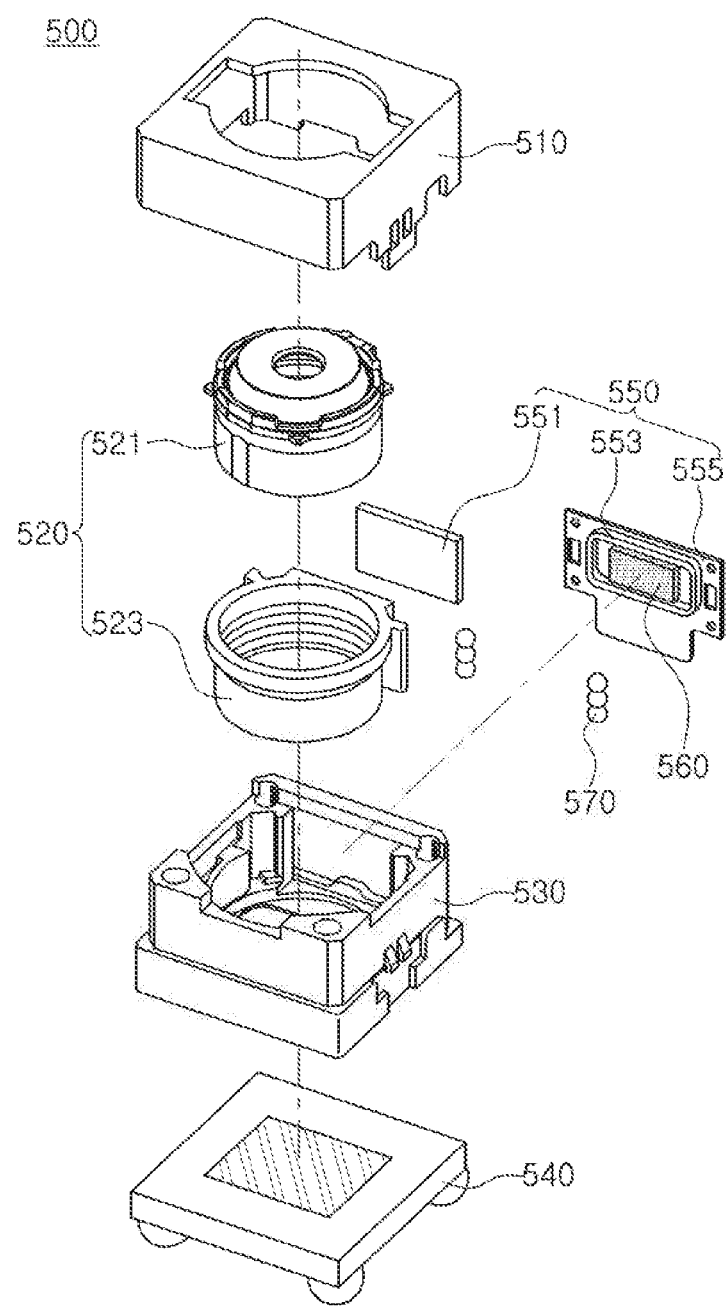
FIG. 19 is a schematic perspective view illustrating a camera module.

FIG. 19 is a schematic perspective view illustrating a camera module.

Referring to the drawing, a camera module 500 according to an exemplary embodiment in the present disclosure may include a housing 530 accommodating a lens module 520 therein and an image sensor module 540 coupled to the housing 530 and converting light passing through the lens module 520 into an electrical signal. In this case, the image sensor module 540 may be any one of the fan-out sensor packages 100A to 100G described above. As described above, the fan-out sensor packages 100A to 100G suggested in the present disclosure may be used in the camera module 500. In this case, a separate infrared lens filter may be omitted. The camera module 500 according to the exemplary embodiment may further include an actuator 550, a ball bearing part 570, a case 510, a controller 560, and the like.

The lens module 520 may include a lens barrel 521 and a lens holder 523 accommodating the lens barrel 521 therein. The lens barrel 521 may have a hollow cylindrical shape so that a plurality of lenses imaging a subject may be accommodated therein, and the plurality of lenses may be provided in the lens barrel 521 on an optical axis. The plurality of lenses may be stacked in a required number depending on a design of the lens module 520 and have optical characteristics such as refractive indices that are the same as or different from each other, or the like.

The lens barrel 521 may be coupled to the lens holder 523. For example, the lens barrel 521 may be inserted into a hollow provided in the lens holder 523, and the lens barrel 521 and the lens holder 523 may be coupled to each other by a screw coupling scheme or may be coupled to each other by an adhesive. The lens module 520 may be accommodated in the housing 530, and may move in an optical axis direction for the purpose of auto-focusing. To this end, the actuator 550 may be provided.

In order to move the lens module 520 in the optical axis direction, the actuator 550 may include a magnet 551 mounted on one surface of the lens holder 523 and a coil 553 disposed to face the magnet 551. The coil 553 may be mounted on a substrate 555. The substrate 555 may be mounted on the housing 530 so that the coil 553 faces the magnet 551.

The coil 553 may move the lens module 520 in the optical axis direction by electromagnetic interaction between the coil 553 and the magnet 551 adjacent to the coil 553. That is, the magnet 551 may form a magnetic field, and when power is applied to the coil 553, driving force by the electromagnetic interaction between the magnet 551 and the coil 553 may be generated to allow the lens module 520 to be moved in the optical axis direction.

The controller 560 may include a driver IC and a position sensor, and may control an operation of the actuator 550. The position sensor may detect a position of the magnet 551 to detect a position of the lens module 520 on which the magnet 551 is mounted. The position sensor may be disposed at the center of the coil 553, having a doughnut shape, or may be disposed at an external surface of the coil 553. The driver IC and the position sensor may be formed integrally with each other as a single element, but are not limited thereto. That is, the driver IC and the position sensor may also be provided as separate elements.

When the lens module 520 moves in the optical axis direction within the housing 530, the ball bearing part 570 may be provided as a guide unit guiding the movement of the lens module 520. The ball bearing part 570 may include one or more ball bearings, and in a case in which a plurality of ball bearings are provided, the plurality of ball bearings may be disposed in the optical axis direction. Here, the plurality of ball bearings may be disposed to be spaced apart from each other in a direction perpendicular to the optical axis direction in relation to the magnet 551. The ball bearing part 570 may contact an outer surface of the lens holder 523 and an inner surface of the housing 530 to guide the movement of the lens module 520 in the optical axis direction. The ball bearing part 570 may be disposed between the lens holder 523 and the housing 530, and may guide the movement of the lens module 520 in the optical axis direction through a rolling motion.

A stopper (not illustrated) may be mounted on the housing 530 to restrict a moving distance of the lens module 520. For example, the stopper (not illustrated) may be mounted on the housing 530, and the stopper (not illustrated) and the lens module 520 may be disposed to be spaced apart from each other in the optical axis direction in a case in which power is not applied to the coil 553. Therefore, when the power is applied to the coil 553 to move the lens module 520 in the optical axis direction, the moving distance of the lens module 520 may be restricted by the stopper (not illustrated), and the lens module 520 may move within an interval range between the lens module 520 and the stopper (not illustrated). In addition, the stopper (not illustrated) may be formed of an elastic material in order to alleviate impacts in a case in which the stopper (not illustrated) and the lens module 520 collide with each other.

The case 510 may be coupled to the housing 530 to surround outer surfaces of the housing 530, and may serve to block electromagnetic waves generated during driving of the camera module. That is, in a case in which the electromagnetic waves generated at the time of driving the camera module are emitted to the outside of the camera module, the electromagnetic waves may affect other electronic components, which may cause communications errors or malfunctions. The case 510 may be formed of a metal to thereby be grounded to a ground pad of the substrate mounted beneath the housing 530, such that the case 510 may block the electromagnetic waves.

Further, in a case in which the case 510 is formed of a plastic injection product, conductive paint may be applied onto inner surfaces of the case 510 to block electromagnetic waves. For example, as the conductive paint, a conductive epoxy may be used, but the material of the conductive paint is not limited thereto. That is, various materials having conductivity may be used, and a conductive film or conductive tape may be attached to the inner surfaces of the case 510.

Meanwhile, a structure of the camera module 500 is not limited thereto, but may also be a known other structure including a lens module, a housing, and an image sensor module.

As set forth above, according to the exemplary embodiment in the present disclosure, a fan-out sensor package of which miniaturization and performance improvement are possible, and a camera module including the same, may be provided.

While exemplary embodiments have been shown and described above, it will be apparent to those skilled in the art that modifications and variations could be made without departing from the scope of the present invention as defined by the appended claims.

What is claimed is:

1. A fan-out sensor package comprising:
a sensor having a first surface having connection pads and a sensing unit disposed thereon and a second surface opposing the first surface;
an interconnection member disposed on the second surface of the sensor, and including a redistribution layer, at least a portion of the redistribution layer extending from a fan-in region to a fan-out region; and
an encapsulant covering at least a portion of the first surface of the sensor and at least a portion of a side surface of the sensor, the side surface of the sensor being disposed between the first and second surfaces of the sensor, wherein the redistribution layer of the interconnection member is electrically connected to the connection pads of the sensor through through-electrodes penetrating through the sensor.

2. The fan-out sensor package of claim 1, wherein at least a portion of the encapsulant is disposed adjacent to the sensing unit of the sensor.

3. The fan-out sensor package of claim 1, wherein the sensor includes a center region overlapped the sensing unit in plane view and an outer region surrounding the center region, and
the through-electrodes penetrate through the sensor in the outer region.

4. The fan-out sensor package of claim 1, further comprising a passive component disposed above the interconnection member, disposed next to the sensor, and electrically connected to the redistribution layer of the interconnection member,
wherein the encapsulant covers at least a portion of the passive component.

5. The fan-out sensor package of claim 1, wherein the sensing unit includes microlenses disposed on the first surface of the sensor.

6. The fan-out sensor package of claim 5, further comprising a filter disposed on the first surface of the sensor and protecting the microlenses,
wherein one surface of the filter is externally exposed.

7. The fan-out sensor package of claim 6, wherein the externally exposed one surface of the filter is disposed on a level substantially planar with an exterior surface of the encapsulant.

8. The fan-out sensor package of claim 1, further comprising:
a passivation layer disposed below the interconnection member, and having openings penetrating through the passivation layer and exposing at least portions of the redistribution layer of the interconnection member;
an under-bump metal layer disposed on the openings of the passivation layer, and connected to the exposed portions of the redistribution layer of the interconnection member; and
connection terminals disposed below the passivation layer and connected to the under-bump metal layer.

9. The fan-out sensor package of claim 1, wherein the sensor is an image sensor.

10. A fan-out sensor package comprising:
an interconnection member including a redistribution layer;
a sensor disposed above the interconnection member, and having a first surface having connection pads and microlenses disposed thereon and a second surface opposing the first surface, the second surface of the sensor facing the interconnection member;
a via disposed above the interconnection member, and disposed next to the sensor;
an encapsulant disposed above the interconnection member, and encapsulating at least a portion of the sensor, the sensor and the via being spaced apart by at least the encapsulant;
a rear redistribution layer disposed above the encapsulant; and
rear vias penetrating thorough the encapsulant and electrically connecting the connection pads of the sensor and the rear redistribution layer to each other,
wherein the sensor and the via are disposed between the interconnection member and the rear redistribution layer, and
the redistribution layer of the interconnection member is electrically connected to the connection pads of the sensor through at least the via, the rear redistribution layer, and the rear vias.

11. The fan-out sensor package of claim 10, further comprising a filter disposed above the first surface of the sensor and protecting the microlenses,
wherein one surface of the filter is externally exposed.

12. The fan-out sensor package of claim 11, wherein the externally exposed one surface of the filter is disposed on a level below the rear redistribution layer, with respect to the second surface of the sensor.

13. The fan-out sensor package of claim 11, wherein the externally exposed one surface of the filter is disposed on a level substantially planar with an exterior surface of the encapsulant.

14. The fan-out sensor package of claim 10, further comprising a passive component disposed above the interconnection member, disposed next to the sensor, and electrically connected to the redistribution layer of the interconnection member,
wherein the encapsulant encapsulates at least a portion of the passive component.

15. The fan-out sensor package of claim 10, further comprising:
a passivation layer disposed below the interconnection member, and having openings penetrating through the passivation layer and exposing at least portions of the redistribution layer of the interconnection member;
an under-bump metal layer disposed on the openings of the passivation layer, and connected to the exposed portions of the redistribution layer of the interconnection member; and
connection terminals disposed below the passivation layer and connected to the under-bump metal layer.

16. A fan-out sensor package comprising:
a sensor having a first surface having connection pads and microlenses disposed thereon and a second surface opposing the first surface;
a via disposed next to the sensor;
an encapsulant encapsulating at least a portion of the sensor, the sensor and the via being spaced apart by at least the encapsulant;
an interconnection member disposed above the sensor, the via and the encapsulant, including a redistribution layer, and having an opening exposing the microlenses of the sensor;
a connection terminal disposed below the encapsulant;
wherein the second surface of the sensor faces the interconnection member,
the sensor and the via are disposed between the interconnection member and the connection terminal, and
the connection pads of the sensor are electrically connected to the connection terminal through at least the redistribution layer of the interconnection member and the via.

17. The fan-out sensor package of claim 16, further comprising an infrared cut-off filter layer disposed above the interconnection member and covering the microlenses.

18. The fan-out sensor package of claim 16, further comprising an under-bump metal layer disposed between the via and the connection terminal, and electrically connecting the via and the connection terminal to each other.

* * * * *